US012656415B2

(12) United States Patent (10) Patent No.: US 12,656,415 B2
Pavlov et al. (45) Date of Patent: Jun. 16, 2026

(54) CORE-BASED CURRENT SENSORS WITH INTEGRATED COMPENSATION COILS

(71) Applicant: Allegro MicroSystems, LLC, Manchester, NH (US)

(72) Inventors: Emil Pavlov, Heidelberg (DE); Simon E. Rock, Heidelberg (DE)

(73) Assignee: Allegro MicroSystems, LLC, Manchester, NH (US)

( * ) Notice: Subject to any disclaimer, the term of this patent is extended or adjusted under 35 U.S.C. 154(b) by 160 days.

(21) Appl. No.: 18/606,068

(22) Filed: Mar. 15, 2024

(65) Prior Publication Data

US 2025/0291003 A1 Sep. 18, 2025

(51) Int. Cl.
*G01R 33/00* (2006.01)
*G01R 3/00* (2006.01)
*G01R 15/20* (2006.01)

(52) U.S. Cl.
CPC ........... *G01R 33/0017* (2013.01); *G01R 3/00* (2013.01); *G01R 15/202* (2013.01); *G01R 15/205* (2013.01); *G01R 15/207* (2013.01)

(58) Field of Classification Search
CPC .... G01R 33/0017; G01R 3/00; G01R 15/202; G01R 15/205; G01R 15/207; G01R 15/185
See application file for complete search history.

(56) References Cited

U.S. PATENT DOCUMENTS 7,259,545 B2 8/2007 Stauth et al.
7,518,354 B2 4/2009 Stauth et al.
7,746,056 B2 6/2010 Stauth et al.
7,923,996 B2 4/2011 Doogue et al.
8,030,918 B2 10/2011 Doogue et al.
8,447,556 B2 5/2013 Friedrich et al.

(Continued)

FOREIGN PATENT DOCUMENTS

CN 103983832 B * 11/2016
EP 1 450 176 A1 8/2004
JP 2004317166 A * 11/2004 ........... G01R 15/185

OTHER PUBLICATIONS

Extended European Search Report dated Jul. 2, 2025 for European Application No. 25157490.1; 11 Pages.
A1162 Datasheet, Rev. 4; Programmable Precision Hall-Effect Switch with Advanced Diagnostics; Allegro MicroSystems, LLC; Sep. 2023; 23 pages.

(Continued)

*Primary Examiner* — Feba Pothen
(74) *Attorney, Agent, or Firm* — DALY, CROWLEY, MOFFORD & DURKEE, LLP

(57) ABSTRACT

Systems, circuits, and methods provide core-based closed-loop current sensors utilizing a coil connected to an IC having a magnetic field sensor configured to measure current in one or more conductors such as busbars. A closed-loop current sensor includes a magnetic core having first and second ends separated by a gap and an aperture receiving the one or more conductors; a magnetic field sensor disposed on a substrate and integrated in an IC is disposed in the gap, where the magnetic field sensor is configured to receive magnetic flux from the gap, where the IC is configured to measure AC current in the one or more conductors; and a coil integrated with the substrate and coupled to the IC, wherein the coil is configured to provide negative magnetic feedback for closed-loop compensation.

28 Claims, 4 Drawing Sheets

(56) References Cited

U.S. PATENT DOCUMENTS

| | | | |
|---|---|---|---|
| 8,542,010 B2 | 9/2013 | Cesaretti et al. | |
| 8,680,846 B2 | 3/2014 | Cesaretti et al. | |
| 8,692,546 B2 | 4/2014 | Cesaretti et al. | |
| 8,818,749 B2 | 8/2014 | Friedrich et al. | |
| 9,151,807 B2 | 10/2015 | Friedrich et al. | |
| 9,664,494 B2 | 5/2017 | Fernandez et al. | |
| 10,132,879 B2 | 11/2018 | Latham et al. | |
| 10,145,908 B2 | 12/2018 | David et al. | |
| 10,495,699 B2 | 12/2019 | Burdette et al. | |
| 10,670,672 B2 | 6/2020 | David et al. | |
| 10,725,100 B2 | 7/2020 | Milano et al. | |
| 10,908,232 B2 | 2/2021 | Latham et al. | |
| 11,313,924 B2 | 4/2022 | David et al. | |
| 12,306,217 B2 * | 5/2025 | Houis | G01R 19/0092 |
| 2022/0196763 A1 | 6/2022 | David et al. | |
| 2022/0397617 A1 | 12/2022 | Schaller et al. | |

OTHER PUBLICATIONS

A1160 Datasheet, Rev. 5; Chopper-Stabilized Precision Hall-Effect Switch with Advanced Diagnostics; Allegro MicroSystems, LLC; Jun. 2022; 13 pages.
A1342 Datasheet, Rev. 2; Programmable Linear Hall IC with Advanced Diagnostics for Safety-Critical Applications; Allegro MicroSystems, LLC; Jul. 2020; 48 pages.
A1346 Datasheet, Rev. 7; Programmable Linear Hall IC with Advanced Diagnostics for Safety-Critical Applications; Allegro MicroSystems, LLC; Apr. 2022; 53 pages.
ACS37610 Datasheet, Rev. 1; Coreless, High Precision, Hall-Effect Current Sensor IC with Common-Mode Field Rejection, Overcurrent and Overtemperature Detection; Allegro MicroSystems, LLC; Dec. 2023; 40 pages.
Response to Extended European Search Report (EESR) dated Jul. 2, 2025 for European Application No. 25157490.1; Response Filed Mar. 6, 2026; 15 Pages.

* cited by examiner

400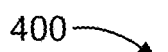

Providing a magnetic core having first and second ends and an aperture receiving one or more conductors, wherein the magnetic core is configured so that the first and second ends are separated by a gap

402

Providing a magnetic field sensor disposed on a substrate and connected to, e.g., integrated in, an integrated circuit (IC), wherein the magnetic field sensor is configured to receive magnetic flux from the gap, wherein the IC is configured to measure AC current in the one or more conductors

404

Providing a coil integrated with the substrate and coupled to the IC, wherein the coil is configured to provide negative magnetic feedback for closed-loop compensation

406

Wherein the one or more conductors comprise one or more busbars

408

Wherein the one or more busbars include first and second busbars configured to conduct input and output current in opposite directions, respectively, and wherein the magnetic field sensor is configured to sense a difference in magnetic fluxes caused by a leakage current

CORE-BASED CURRENT SENSORS WITH INTEGRATED COMPENSATION COILS

BACKGROUND

Magnetic-core-based (core-based) current sensors are often categorized as being either closed-loop or open-loop designs. Open-loop core-based current transducers typically are employed with the magnetic core placed around a conductor and amplify a voltage of a magnetic field/flux sensor, such as a Hall effect sensor or magnetoresistance (xMR) sensor, a to provide an output voltage indicative of the current in the conductor.

Compared to an open loop transducer, closed loop transducers (sometimes called "compensated" or "zero flux" transducers) typically have a compensation circuit to improve performance. While open loop current transducers amplify the magnetic field sensor voltage to provide an output voltage, closed loop transducers utilize the magnetic field sensor voltage to create a compensation current (FIG. 1) in a secondary coil to create a total flux, as measured by the magnetic field sensor, equal to zero. In other words, the secondary current, $I_S$, creates a flux equal in amplitude, but opposite in direction, to the flux created by the primary current.

FIG. 1 shows a diagram of a representative prior art core-based closed-loop current sensor 100. As shown, current sensor 100 includes a magnetic core 101 is shown configured about a conductor 102, which represents a primary current path carrying a current ($I_P$) during operation. The magnetic core has a gap 101a formed in it, where a magnetic field sensor 105, typically a Hall effect sensor, is positioned. (A person of ordinary skill in the art will understand that the sensor structure described to this point represents an open-loop core-based current sensor.) In operation, the current carried by the conductor 102 creates a magnetic field. This field is concentrated by the magnetic core 101 and the magnetic flux density across the gap is measured by the magnetic field sensor 105. The control current, IC, and Differential amplification are supplied by electronics (FIG. 1) built into the transducer.

Current sensor 100 also includes a compensation or secondary coil 103 as part of a compensation circuit used to improve performance. While open-loop current transducers amplify the sensing element output voltage, e.g., Hall effect element voltage, to provide an output voltage, closed-loop transducers such as sensor 100 use the sensing element (e.g., Hall effect sensor) output voltage 106 in a circuit 107, e.g., after amplification, to create a compensation current ($I_C$) in a circuit secondary coil 103 to create a total flux, as measured by the Hall generator, equal to zero. The secondary current, $I_S$, effectively creates a flux equal in amplitude, but opposite in direction, to the flux created by the primary current.

Operating the magnetic field sensor in a zero flux condition can eliminate the drift of gain with temperature. An additional advantage of this configuration is that the secondary winding will act as a current transformer at higher frequencies, significantly extending the bandwidth and reducing the response time of the transducer. When the magnetic flux is fully compensated (zero), the magnetic potential (ampere-turns) of the two coils are identical. Consequently, the secondary current, $I_S$, is the exact image of the primary current, $I_P$, being measured. Inserting a measurement resistor 108, $R_M$, in series with the secondary coil can create an output voltage that a replica (scaled version) of the measured current.

Core-based closed-loop current sensors have two major advantages versus open-loop sensors: first, the core does not saturate; second, they typically have better accuracy. Closed-loop sensors, however, require a costly and cumbersome process in which a coil is looped around the core (to provide the compensation field for countering the sensed field). Closed-loop sensors also typically have a larger footprint and additional complexity relative to open-loop sensors.

SUMMARY

Aspects of the present disclosure are directed to core-based current sensors with integrated compensation coils and related methods.

One general aspect of the present disclosure includes a closed-loop current sensor. The closed-loop current sensor can include: a magnetic core having first and second ends and an aperture receiving one or more conductors, where the magnetic core is configured so that the first and second ends are separated by a gap; a magnetic field sensor connected to, e.g., disposed in, an integrated circuit (IC) and supported by a substrate, where the magnetic field sensor is configured to receive magnetic flux from the gap, where the IC is configured to measure AC current in the one or more conductors; and a coil integrated with the substrate and coupled to the IC, where the coil is configured to provide negative magnetic feedback for closed-loop compensation.

Implementations may include one or more of the following features. The one or more conductors may include one or more busbars. The one or more busbars may include first and second busbars. The first and second busbars can be configured to conduct input and output current in opposite directions, respectively, where the magnetic field sensor is configured to sense a difference in magnetic fluxes caused by a leakage current. The magnetic core may include a soft ferromagnetic material. The soft ferromagnetic material may include ferrite. The magnetic field sensor may include one or more Hall effect elements. The magnetic field sensor may include one or more magnetoresistive (xMR) elements. The magnetic field sensor may include one or more tunneling magnetoresistive (TMR) elements. The magnetic field sensor may include one or more giant magnetoresistive (GMR) elements. The magnetic field sensor may include one or more anisotropic magnetoresistive (AMR) elements. The magnetic field sensor can be disposed in the gap. The magnetic core may include a C-core shape. The coil may be integrated in the IC. The coil (and IC) may be disposed on the substrate. The substrate may include a printed circuit board (PCB).

Another general aspect of the present disclosure includes a method of making a closed-loop current sensor. The method can include: providing a magnetic core having first and second ends and an aperture receiving one or more conductors, where the magnetic core is configured so that the first and second ends are separated by a gap; providing a magnetic field sensor connected to, e.g., disposed in, an IC and supported on a substrate, where the magnetic field sensor is configured to receive magnetic flux from the gap, where the IC is configured to measure AC current in the one or more conductors; and providing a coil integrated with the substrate and coupled to, e.g., disposed in, the IC, where the coil is configured to provide negative magnetic feedback for closed-loop compensation.

Implementations may include one or more of the following features. The one or more conductors may include one or more busbars. The one or more busbars may include first and second busbars. The first and second busbars may be configured to conduct input and output current in opposite directions, respectively, where the magnetic field sensor is configured to sense a difference in magnetic fluxes caused by a leakage current. The magnetic core may include a soft ferromagnetic material. The soft ferromagnetic material may include ferrite. The magnetic field sensor may include one or more Hall effect elements. The magnetic field sensor may include one or more magnetoresistive (xMR) elements. The magnetic field sensor may include one or more tunneling magnetoresistive (TMR) elements. The magnetic field sensor includes one or more giant magnetoresistive (GMR) elements. The magnetic field sensor may include one or more anisotropic magnetoresistive (AMR) elements. The magnetic field sensor can be disposed or configured in the (air) gap. The magnetic core may include a C-core shape. The coil can be connected to, e.g., integrated in, the IC. The coil can be disposed on the substrate. The substrate may include a printed circuit board (PCB).

The features and advantages described herein are not all-inclusive; many additional features and advantages will be apparent to one of ordinary skill in the art in view of the drawings, specification, and claims. Moreover, it should be noted that the language used in the specification has been selected principally for readability and instructional purposes, and not to limit in any way the scope of the present disclosure, which is susceptible of many embodiments. What follows is illustrative, but not exhaustive, of the scope of the present disclosure.

BRIEF DESCRIPTION OF THE DRAWINGS

The manner and process of making and using the disclosed embodiments may be appreciated by reference to the figures of the accompanying drawings. It should be appreciated that the components and structures illustrated in the figures are not necessarily to scale, emphasis instead being placed upon illustrating the principals of the concepts described herein. Furthermore, embodiments are illustrated by way of example and not limitation in the figures, in which:

FIG. 4 shows steps in an example method of making a core-based closed-loop current sensor employing an integrated coil, in accordance with the present disclosure.

DETAILED DESCRIPTION

The features and advantages described herein are not all-inclusive; many additional features and advantages will be apparent to one of ordinary skill in the art in view of the drawings, specification, and claims. Moreover, it should be noted that the language used in the specification has been selected principally for readability and instructional purposes, and not to limit in any way the scope of the inventive subject matter. The subject technology is susceptible of many embodiments. What follows is illustrative, but not exhaustive, of the scope of the subject technology.

Aspects of the present disclosure are directed to and include systems, circuits, and methods providing core-based closed-loop current sensors that utilize a coil integrated into a substrate having an IC configured to measure current. The sensors can provide similar accuracy as prior-art techniques while also providing for greater simplification and reduced cost for the related manufacturing process(es).

Figure 1:
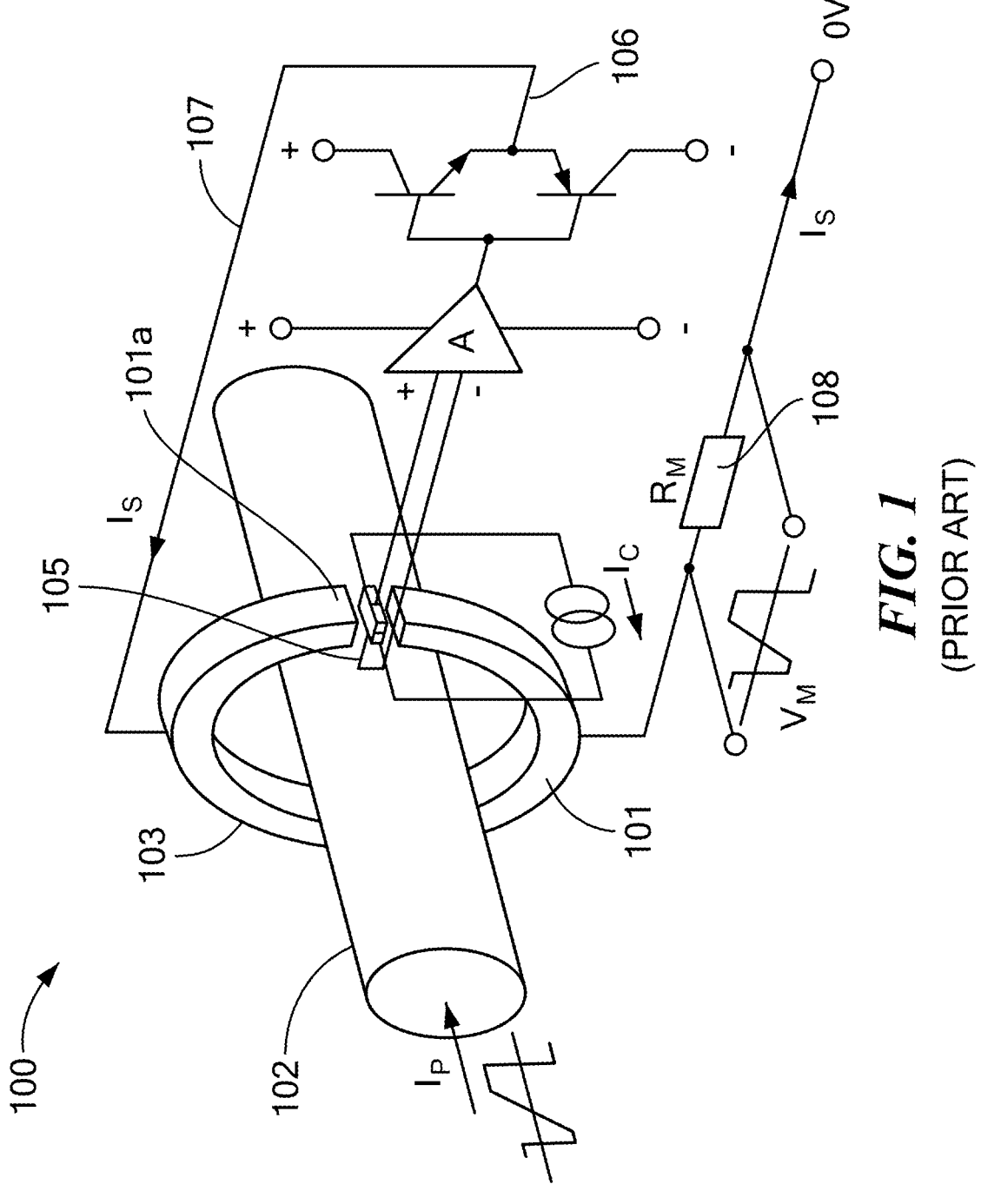
FIG. 1 shows an example prior art core-based closed-loop current sensor.
Figure 2:
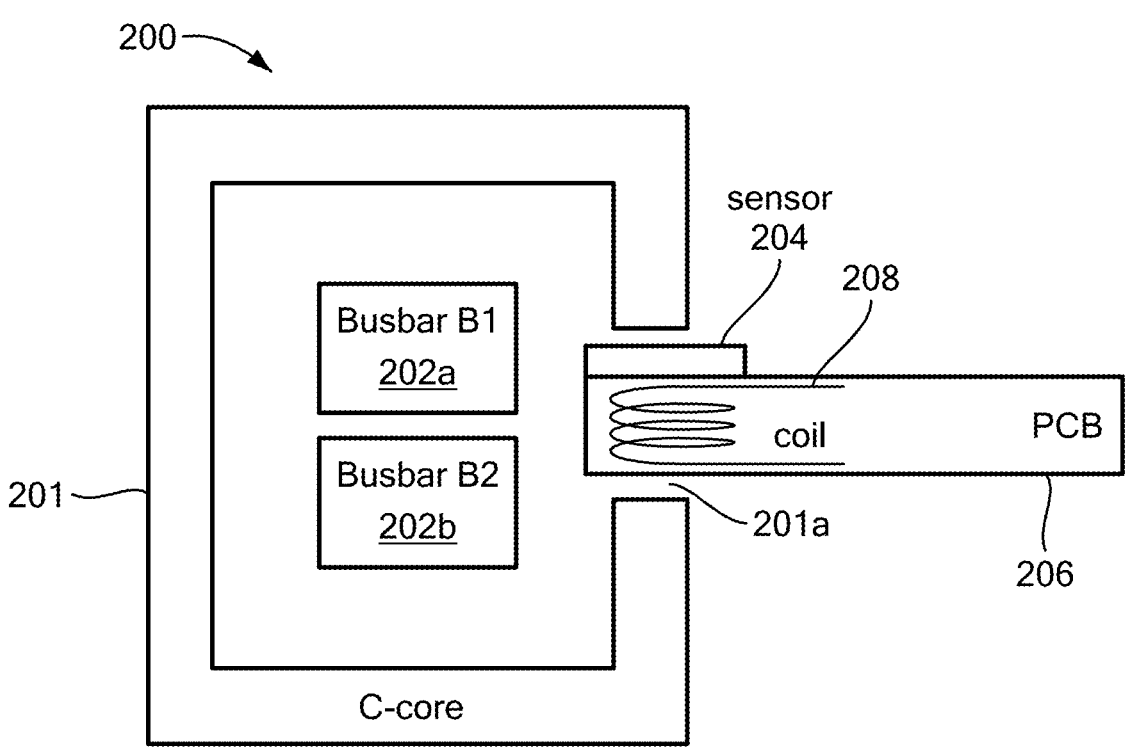
FIG. 2 shows an example core-based closed-loop current sensor employing an integrated coil, in accordance with the present disclosure.

FIG. 2 shows an example core-based closed-loop current sensor 200 employing an integrated coil, in accordance with the present disclosure.

Sensor 200 includes a ferromagnetic C-core 201. Core 201 is shown surrounding two busbars 202a and 202b. In some embodiments, as shown, the busbars 202a-b can be configured to carry respective currents that are in opposite directions. For example, the busbars 202a-b can carry the input and output current to and out of a system (e.g., a traction inverter or power module for an EV or hybrid vehicle), so they would create the same magnetic flux in opposite directions. As a result, only the leakage current would produce a magnetic field, and since the leakage current is generally small, the core would be operated far from its magnetic saturation point.

A magnetic field (flux) sensor 204 is shown disposed on a substrate 206 and positioned/inserted into the air gap 201a of the C-core 201. Sensor 204 can be integrated on an IC. Any suitable magnetic field sensor may be used for sensor 204. Examples include but are not limited to magnetic field sensors employing Hall effect elements and/or magnetoresistance (xMR) elements. The latter can include tunneling magnetoresistance elements (TMR), giant magnetoresistance elements (GMR), and/or anisotropic magnetoresistance (AMR) elements. Compensation coil 208 is additionally added into the air gap 201a, as shown. Coil 208 can be connected to an IC, e.g., an IC including sensor 204. The coil 208 may be integrated on the substrate 206 (e.g., PCB) or directly in an IC or IC package. The coil 208 can be used to compensate the magnetic field of the leakage current, thus enabling closed-loop operation. While not shown, other components, e.g., one or more additional ICs and/or discrete components, may be disposed on substrate 206 with suitable electrical connections.

Figure 3:
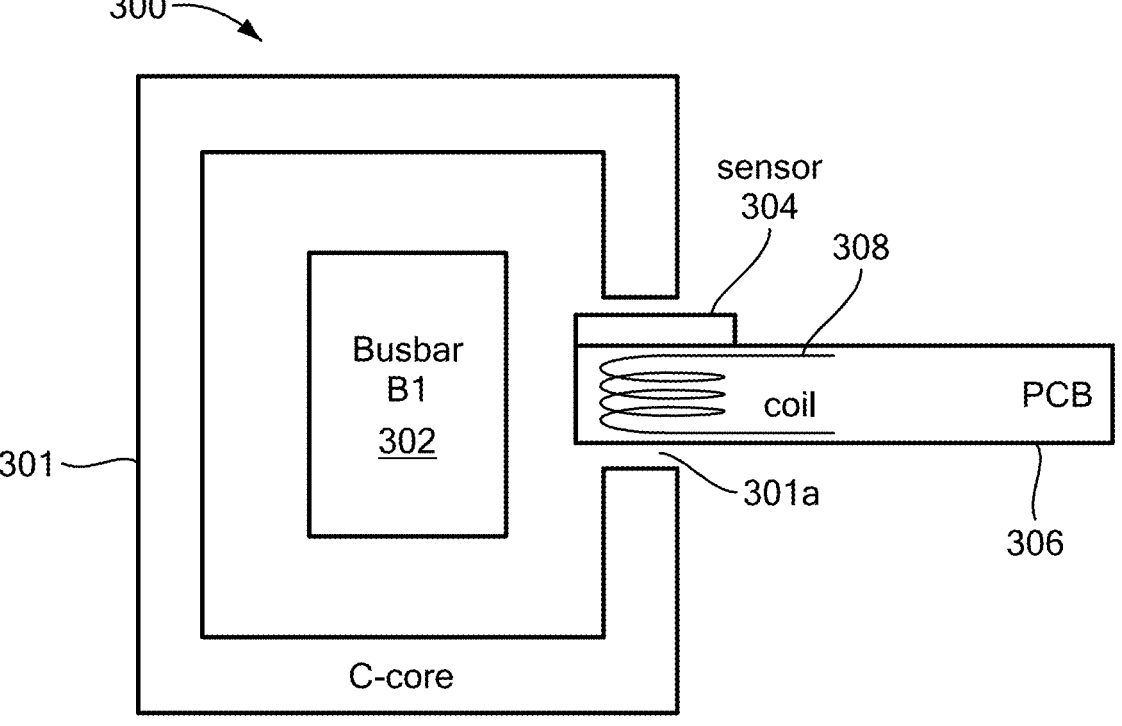
FIG. 3 is a diagram showing an alternate embodiment of a core-based closed-loop current sensor with integrated coil, in accordance with the present disclosure.

FIG. 3 is a diagram showing an alternate embodiment of a core-based closed-loop current sensor 300 with integrated coil, in accordance with the present disclosure. FIG. 3 shows sensor 300 in a configuration similar to that of FIG. 2 except a single conductor (e.g., busbar) is shown for carrying current, in accordance with the present disclosure.

Sensor 300 includes a ferromagnetic C-core 301. Core 301 is shown surrounding a single conductor 301, e.g., busbar. A magnetic field (flux) sensor 304 is shown disposed on a substrate 306 and positioned/inserted into the air gap 301a of the C-core 301. Sensor 304 can be integrated on an IC. Any suitable magnetic field sensor may be used. Examples include but are not limited to magnetic field sensors employing Hall effect elements and/or magnetoresistance (xMR) elements. The latter can include tunneling magnetoresistance elements (TMR), giant magnetoresistance elements (GMR), and/or anisotropic magnetoresistance (AMR) elements. Compensation coil 308 is additionally added into the air gap 301a, as shown. Compensation coil 308 can be connected to an IC, e.g., an IC including sensor 304. The coil 308 may be integrated on the substrate (e.g., PCB) or directly in an IC and can be used to compensate the magnetic field of the leakage current, thus enabling the closed loop operation. While not shown, other components, e.g., one or more additional ICs and/or discrete components, may be disposed on substrate 203 with suitable electrical connections.

FIG. 4 shows steps in an example method 400 of making a closed-loop current sensor employing an integrated coil, in accordance with the present disclosure. Method 400 can include providing a magnetic core having first and second ends and an aperture receiving one or more conductors, wherein the magnetic core is configured so that the first and second ends are separated by a gap, as described at 402. Any suitable soft (magnetic property) ferromagnetic material may be used for the magnetic core. Examples of suitable soft ferromagnetic materials may include but are not limited to ferrite, nickel iron, ferrous silicon, etc. A magnetic field sensor can be provided that is disposed on a substrate and connected to (e.g., integrated in) an integrated circuit (IC), where the magnetic field sensor is configured to receive magnetic flux from the gap, wherein the IC is configured to measure AC current in the one or more conductors, as described at 404. Any suitable magnetic field sensor may be used. Examples include but are not limited to one or more Hall effect sensors employing Hall effect elements and one or more magnetoresistance (xMR) sensors employing suitable xMR elements; suitable xMR elements include but are not limited TMR, GMR, and AMR elements. Any suitable substrate may be used for the sensor. Examples of suitable substrates may include but are not limited to printed circuit boards (PCBs), ceramic substrates—e.g., high-temperature cofired ceramic (HTCC), low-temperature cofired ceramic (LTCC), glass substrate, etc.

Continuing with the description of method 400, a coil can be provided that is integrated with the substrate and coupled to the IC, where the coil is configured to provide negative magnetic feedback for closed-loop compensation, as described at 406. The one or more conductors can include one or more busbars in some embodiments, as described at 408. The one or more busbars may include first and second busbars configured to conduct input and output current in opposite directions, respectively, where the magnetic field sensor is configured to sense a difference in magnetic fluxes caused by a leakage current, as described at 410.

Figure 5:
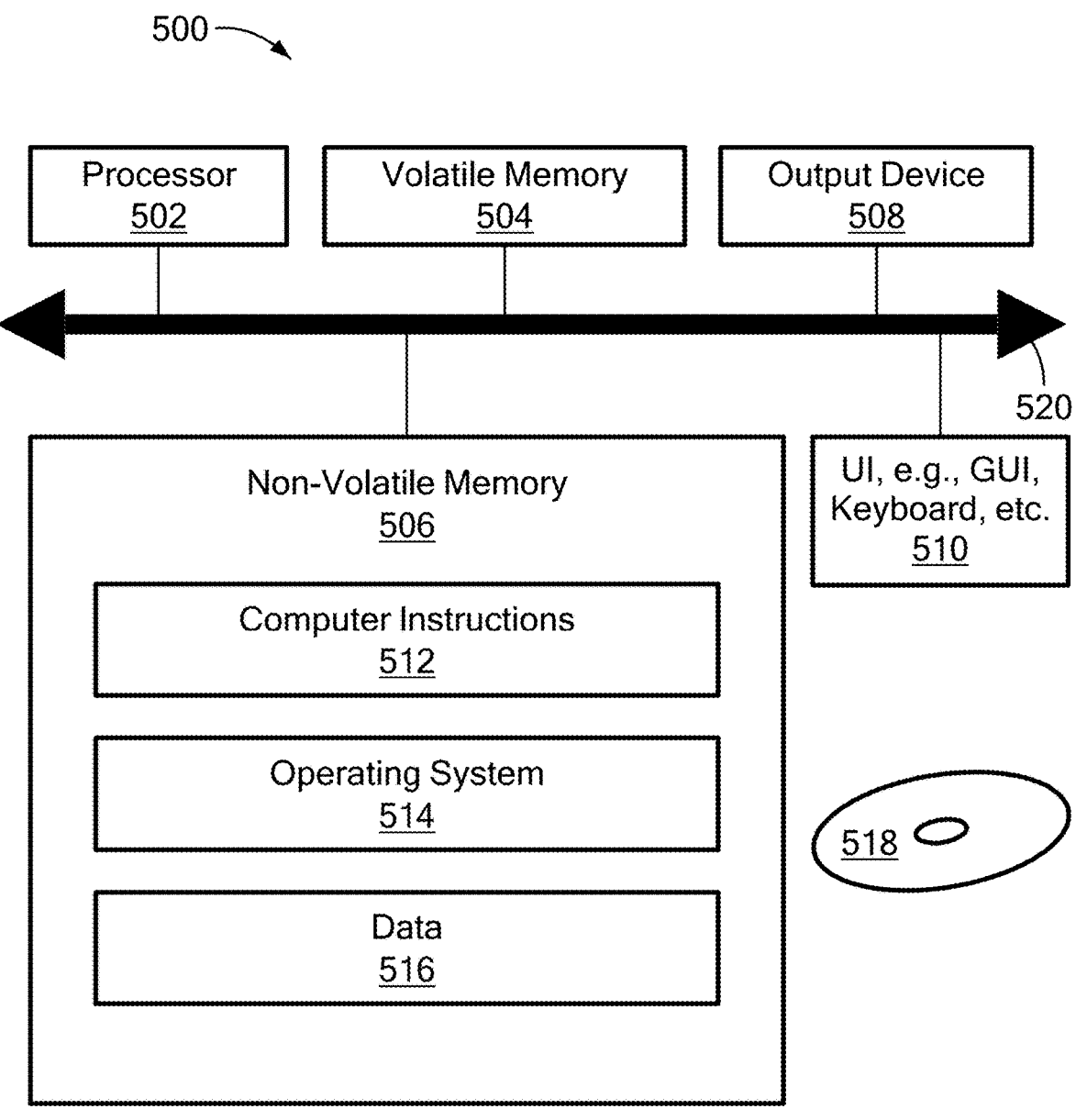
FIG. 5 is a block diagram of an example computer system operative to perform processing, in accordance with the present disclosure.

FIG. 5 is a block diagram of an example computer system 500 operative to perform processing, in accordance with the present disclosure, e.g., computation (calculation) of an AC current based on an output signal or signals received from a current sensor. Computer system 500 can perform all or at least a portion of the processing, e.g., steps in algorithms and methods, described herein. The computer system 500 includes a processor 502, a volatile memory 504, a non-volatile memory 506 (e.g., hard disk, etc.), an output device 508 and a user input or interface (UI) 510, e.g., graphical user interface (GUI), a mouse, a keyboard, a display, and/or any common user interface, etc. The non-volatile memory (non-transitory storage medium) 506 stores computer instructions 512 (a.k.a., machine-readable instructions or computer-readable instructions) such as software (computer program product), an operating system 514 and data 516. In some examples/embodiments, the computer instructions 512 can be executed by the processor 502 out of (from) volatile memory 504. In some examples/embodiments, an article 518 (e.g., a storage device or medium such as a hard disk, an optical disc, magnetic storage tape, optical storage tape, flash drive, etc.) includes or stores the non-transitory computer-readable instructions. Bus 520 is also shown. In some embodiments, one or more components of system 500 can be disposed on or connected to one or more integrated circuits on one or more semiconductor die.

Processing may be implemented in hardware, software, or a combination of the two. Processing may be implemented in computer programs (e.g., software applications) executed on programmable computers/machines that each includes a processor, a storage medium or other article of manufacture that is readable by the processor (including volatile and non-volatile memory and/or storage elements), and optionally at least one input device, and one or more output devices. Program code may be applied to data entered using an input device or input connection (e.g., a port or bus) to perform processing and to generate output information.

The system 500 can perform processing, at least in part, via a computer program product or software application, (e.g., in a machine-readable storage device), for execution by, or to control the operation of, data processing apparatus (e.g., a programmable processor, a computer, or multiple computers). Each such program may be implemented in a high-level procedural or object-oriented programming language to communicate with a computer system. The programs may be implemented in assembly or machine language. The language may be a compiled or an interpreted language and it may be deployed in any form, including as a stand-alone program or as a module, component, subroutine, or other unit suitable for use in a computing environment. A computer program may be deployed to be executed on one computer or on multiple computers at one site or distributed across multiple sites and interconnected by a communication network. A computer program may be stored on a storage medium or device (e.g., CD-ROM, hard disk, or magnetic diskette) that is readable by a general or special purpose programmable computer for configuring and operating the computer when the storage medium or device is read by the computer. Processing may also be implemented as a machine-readable storage medium, configured with a computer program, where upon execution, instructions in the computer program cause the computer to operate. Further, the terms "computer" or "computer system" may include reference to plural like terms, unless expressly stated otherwise.

Processing may be performed by one or more programmable processors executing one or more computer programs to perform the functions of the system. All or part of the system may be implemented as special purpose logic circuitry, e.g., an FPGA (field programmable gate array) and/or an ASIC (application-specific integrated circuit). In some examples, digital logic circuitry, e.g., one or more FPGAs, can be operative as one or more processors as described herein.

Accordingly, embodiments of the inventive subject matter can afford various benefits relative to prior art techniques. For example, embodiments and examples of the present disclosure can provide, enable and/or facilitate core-based closed-loop current sensors that employ a coil integrated with/on a substrate to which a magnetic field sensor is disposed, providing high bandwidth but much lower cost than prior art systems. Moreover, such closed-loop systems can afford or provide less complexity relative to prior techniques.

Various embodiments of the concepts, systems, devices, structures, and techniques sought to be protected are described above with reference to the related drawings. Alternative embodiments can be devised without departing from the scope of the concepts, systems, devices, structures, and techniques described.

It is noted that various connections and positional relationships (e.g., over, below, adjacent, etc.) may be used to describe elements and components in the description and drawings. These connections and/or positional relationships, unless specified otherwise, can be direct or indirect, and the described concepts, systems, devices, structures, and techniques are not intended to be limiting in this respect. Accordingly, a coupling of entities can refer to either a direct or an indirect coupling, and a positional relationship between entities can be a direct or indirect positional relationship.

As an example of an indirect positional relationship, positioning element "A" over element "B" can include situations in which one or more intermediate elements (e.g., element "C") is between elements "A" and elements "B" as long as the relevant characteristics and functionalities of elements "A" and "B" are not substantially changed by the intermediate element(s).

Also, the following definitions and abbreviations are to be used for the interpretation of the claims and the specification. The terms "comprise," "comprises," "comprising," "include," "includes," "including," "has," "having," "contains" or "containing," or any other variation are intended to cover a non-exclusive inclusion. For example, an apparatus, a method, a composition, a mixture, or an article, including a list of elements is not necessarily limited to only those elements but can include other elements not expressly listed or inherent to such apparatus, method, composition, mixture, or article.

Additionally, the term "exemplary" means "serving as an example, instance, or illustration. Any embodiment or design described as "exemplary" is not necessarily to be construed as preferred or advantageous over other embodiments or designs. The terms "one or more," "plurality," and "at least one" may indicate any integer number greater than or equal to one, i.e., one, two, three, four, etc.; those terms, however, may refer to fractional numbers/values where context admits, e.g., a number of loops (turns) in a coil may be referred to as "one or more," "a plurality," or "at least one" and that number may have a fractional value, e.g., 1.8, 2.75, 3.5, 4.66, etc. The term "connection" can include an indirect "connection" and a direct "connection".

References in the specification to "embodiments," "one embodiment, "an embodiment," "an example embodiment," "an example," "an instance," "an aspect," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it may affect such feature, structure, or characteristic in other embodiments whether explicitly described or not.

Relative or positional terms including, but not limited to, the terms "upper," "lower," "right," "left," "vertical," "horizontal, "top," "bottom," and derivatives of those terms relate to the described structures and methods as oriented in the drawing figures. The terms "overlying," "atop," "on top, "positioned on" or "positioned atop" mean that a first element, such as a first structure, is present on a second element, such as a second structure, where intervening elements such as an interface structure can be present between the first element and the second element. The term "direct contact" means that a first element, such as a first structure, and a second element, such as a second structure, are connected without any intermediary elements.

Use of ordinal terms such as "first," "second," "third," etc., in the claims to modify a claim element does not by itself connote any priority, precedence, or order of one claim element over another, or a temporal order in which acts of a method are performed but are used merely as labels to distinguish one claim element having a certain name from another element having a same name (but for use of the ordinal term) to distinguish the claim elements.

The terms "approximately" and "about" may be used to mean within ±20% of a target (or nominal) value in some embodiments, within plus or minus (±) 10% of a target value in some embodiments, within ±5% of a target value in some embodiments, and yet within ±2% of a target value in some embodiments. The terms "approximately" and "about" may include the target value. The term "substantially equal" may be used to refer to values that are within ±20% of one another in some embodiments, within ±10% of one another in some embodiments, within ±5% of one another in some embodiments, and yet within ±2% of one another in some embodiments.

The term "substantially" may be used to refer to values that are within ±20% of a comparative measure in some embodiments, within ±10% in some embodiments, within ±5% in some embodiments, and yet within ±2% in some embodiments. For example, a first direction that is "substantially" perpendicular to a second direction may refer to a first direction that is within ±20% of making a 90° angle with the second direction in some embodiments, within ±10% of making a 90° angle with the second direction in some embodiments, within ±5% of making a 90° angle with the second direction in some embodiments, and yet within ±2% of making a 90° angle with the second direction in some embodiments.

The disclosed subject matter is not limited in its application to the details of construction and to the arrangements of the components set forth in the following description or illustrated in the drawings. The disclosed subject matter is capable of other embodiments and of being practiced and carried out in various ways.

Also, the phraseology and terminology used in this patent are for the purpose of description and should not be regarded as limiting. As such, the conception upon which this disclosure is based may readily be utilized as a basis for the designing of other structures, methods, and systems for carrying out the several purposes of the disclosed subject matter. Therefore, the claims should be regarded as including such equivalent constructions as far as they do not depart from the spirit and scope of the disclosed subject matter.

Although the disclosed subject matter has been described and illustrated in the foregoing exemplary embodiments, the present disclosure has been made only by way of example. Thus, numerous changes in the details of implementation of the disclosed subject matter may be made without departing from the spirit and scope of the disclosed subject matter.

Accordingly, the scope of this patent should not be limited to the described implementations but rather should be limited only by the spirit and scope of the following claims.

All publications and references cited in this patent are expressly incorporated by reference in their entirety.

What is claimed is:

1. A closed-loop current sensor comprising:
   a magnetic core having first and second ends and an aperture receiving a first busbar and a second busbar configured to conduct input and output current in opposite directions, wherein the magnetic core is configured so that the first and second ends are separated by a gap;
   a magnetic field sensor disposed in an integrated circuit (IC) and supported by a substrate, wherein the magnetic field sensor is configured to receive magnetic flux from the gap, wherein the magnetic field sensor is configured to sense a difference in magnetic fluxes of the first busbar and the second busbar caused by a leakage current; and a coil integrated with the substrate and coupled to the IC, wherein the coil is configured to provide negative magnetic feedback based on the leakage current for closed-loop compensation.

2. The sensor of claim 1, wherein the magnetic core comprises a soft ferromagnetic material.

3. The sensor of claim 2, wherein the soft ferromagnetic material comprises ferrite.

4. The sensor of claim 1, wherein the magnetic field sensor includes one or more Hall effect elements.

5. The sensor of claim 1, wherein the magnetic field sensor includes one or more magnetoresistive elements.

6. The sensor of claim 5, wherein the magnetic field sensor includes one or more tunneling magnetoresistive (TMR) elements.

7. The sensor of claim 5, wherein the magnetic field sensor includes one or more giant magnetoresistive (GMR) elements.

8. The sensor of claim 5, wherein the magnetic field sensor includes one or more anisotropic magnetoresistive (AMR) elements.

9. The sensor of claim 1, wherein the magnetic field sensor is disposed in the gap.

10. The sensor of claim 1, wherein the magnetic core comprises a C-core shape.

11. The sensor of claim 1, wherein the coil is integrated in the IC.

12. The sensor of claim 1, wherein the coil is disposed in the substrate.

13. The sensor of claim 1, wherein the substrate comprises a printed circuit board (PCB).

14. A method of making a closed-loop current sensor, the method comprising:

providing a magnetic core having first and second ends and an aperture receiving a first busbar and a second busbar configured to conduct input and output current in opposite directions, wherein the magnetic core is configured so that the first and second ends are separated by a gap;

providing a magnetic field sensor disposed in an integrated circuit (IC) and supported by a substrate, wherein the magnetic field sensor is configured to receive magnetic flux from the gap, wherein the magnetic field sensor is configured to measure a difference in magnetic fluxes of the first busbar and the second busbar; and providing a coil integrated with the substrate and coupled to the IC, wherein the coil is configured to provide negative magnetic feedback based on a leakage current for closed-loop compensation.

15. The method of claim 14, wherein the first and second busbars are configured to conduct input and output current in opposite directions, respectively, and wherein the magnetic field sensor is configured to sense the difference in magnetic fluxes caused by a leakage current.

16. The method of claim 14, wherein the magnetic core comprises a soft ferromagnetic material.

17. The method of claim 16, wherein the soft ferromagnetic material comprises ferrite.

18. The method of claim 14, wherein the magnetic field sensor includes one or more Hall effect elements.

19. The method of claim 14, wherein the magnetic field sensor includes one or more magnetoresistive elements.

20. The method of claim 19, wherein the magnetic field sensor includes one or more tunneling magnetoresistive (TMR) elements.

21. The method of claim 19, wherein the magnetic field sensor includes one or more giant magnetoresistive (GMR) elements.

22. The method of claim 14, wherein the magnetic field sensor includes one or more anisotropic magnetoresistive (AMR) elements.

23. The method of claim 14, wherein the magnetic field sensor is disposed in the gap.

24. The method of claim 14, wherein the magnetic core comprises a C-core shape.

25. The method of claim 14, wherein the coil is integrated in the IC.

26. The method of claim 14, wherein the coil is disposed in the substrate.

27. The method of claim 14, wherein the substrate comprises a printed circuit board (PCB).

28. A closed-loop current sensor comprising:

a magnetic core having first and second ends and an aperture receiving one or more conductors, wherein the magnetic core is configured so that the first and second ends are separated by a gap;

a magnetic field sensor disposed in an integrated circuit (IC) and supported by a printed circuit board (PCB), wherein the magnetic field sensor is configured to receive magnetic flux from the gap, wherein the IC is configured to measure AC current in the one or more conductors; and a coil integrated with the PCB and coupled to the IC, wherein the coil is configured to provide negative magnetic feedback based on a leakage current for closed-loop compensation.

* * * * *